United States Patent
Saunier

(10) Patent No.: US 9,054,167 B2
(45) Date of Patent: Jun. 9, 2015

(54) HIGH ELECTRON MOBILITY TRANSISTOR STRUCTURE AND METHOD

(71) Applicant: TriQuint Semiconductor, Inc., Hillsboro, OR (US)

(72) Inventor: Paul Saunier, Dallas, TX (US)

(73) Assignee: TriQuint Semiconductor, Inc., Hillsboro, OR (US)

(*) Notice: Subject to any disclaimer, the term of this patent is extended or adjusted under 35 U.S.C. 154(b) by 0 days.

(21) Appl. No.: 13/941,413

(22) Filed: Jul. 12, 2013

(65) Prior Publication Data
US 2013/0334538 A1 Dec. 19, 2013

Related U.S. Application Data

(62) Division of application No. 13/282,424, filed on Oct. 26, 2011, now abandoned.

(51) Int. Cl.
| | |
|---|---|
| *H01L 29/76* | (2006.01) |
| *H01L 29/778* | (2006.01) |
| *H01L 29/66* | (2006.01) |
| H01L 21/02 | (2006.01) |
| H01L 29/40 | (2006.01) |
| H01L 29/417 | (2006.01) |
| H01L 29/423 | (2006.01) |

(Continued)

(52) U.S. Cl.
CPC ......... *H01L 29/778* (2013.01); *H01L 21/02458* (2013.01); *H01L 21/0254* (2013.01); *H01L 29/402* (2013.01); *H01L 29/41766* (2013.01); *H01L 29/4236* (2013.01); *H01L 29/42376* (2013.01); *H01L 29/517* (2013.01); *H01L 29/518* (2013.01); *H01L 29/66462* (2013.01); *H01L 29/7787* (2013.01); *H01L 29/2003* (2013.01)

(58) Field of Classification Search
USPC .................. 257/194, 192, E21.403, E29.246; 438/172
See application file for complete search history.

(56) References Cited

U.S. PATENT DOCUMENTS
| | | | |
|---|---|---|---|
| 6,982,204 B2 | 1/2006 | Saxler et al. | |
| 7,038,253 B2 * | 5/2006 | Yoshida et al. | ............... 257/192 |
| 7,419,892 B2 | 9/2008 | Sheppard et al. | |

(Continued)

FOREIGN PATENT DOCUMENTS

EP 0812468 B1 6/1996

OTHER PUBLICATIONS

U.S. Appl. No. 13/278,084, filed Oct. 20, 2011.

(Continued)

*Primary Examiner* — Bradley K Smith
*Assistant Examiner* — David Goodwin
(74) *Attorney, Agent, or Firm* — Schwabe Williamson & Wyatt

(57) ABSTRACT

Embodiments of the present disclosure describe structural configurations of an integrated circuit (IC) device such as a high electron mobility transistor (HEMT) switch device and method of fabrication. The IC device includes a buffer layer formed on a substrate, a channel layer formed on the buffer layer to provide a pathway for current flow in a transistor device, a spacer layer formed on the channel layer, a barrier layer formed on the spacer layer, the barrier layer including aluminum (Al), nitrogen (N), and at least one of indium (In) or gallium (Ga), a gate dielectric directly coupled with the spacer layer or the channel layer, and a gate formed on the gate dielectric, the gate being directly coupled with the gate dielectric. Other embodiments may also be described and/or claimed.

10 Claims, 5 Drawing Sheets

(51) Int. Cl.
*H01L 29/51* (2006.01)
*H01L 29/20* (2006.01)

(56) References Cited

U.S. PATENT DOCUMENTS

| | | | |
|---|---|---|---|
| 7,432,142 B2 | 10/2008 | Saxler et al. | |
| 7,470,941 B2 * | 12/2008 | Micovic et al. | 257/192 |
| 7,501,669 B2 | 3/2009 | Parikh et al. | |
| 7,638,818 B2 | 12/2009 | Wu et al. | |
| 8,198,178 B2 * | 6/2012 | Heikman et al. | 438/478 |
| 8,237,198 B2 * | 8/2012 | Wu et al. | 257/194 |
| 8,304,811 B2 | 11/2012 | Zhang | |
| 2004/0029330 A1 | 2/2004 | Hussain et al. | |
| 2009/0267078 A1 | 10/2009 | Mishra et al. | |
| 2010/0117118 A1 | 5/2010 | Dabiran et al. | |
| 2010/0140664 A1 * | 6/2010 | Sheppard et al. | 257/194 |
| 2010/0187570 A1 | 7/2010 | Saxler et al. | |
| 2010/0259321 A1 | 10/2010 | Tserng et al. | |
| 2010/0270559 A1 | 10/2010 | Ota | |
| 2011/0147706 A1 | 6/2011 | Radosavljevic et al. | |
| 2011/0147713 A1 * | 6/2011 | Pillarisetty et al. | 257/24 |
| 2011/0241020 A1 | 10/2011 | Saunier | |
| 2013/0026495 A1 * | 1/2013 | Chu et al. | 257/77 |
| 2013/0292698 A1 * | 11/2013 | Then et al. | 257/76 |
| 2014/0061658 A1 * | 3/2014 | Chiu et al. | 257/76 |

OTHER PUBLICATIONS

U.S. Appl. No. 13/481,198, filed May 25, 2012.
U.S. Appl. No. 13/535,127, filed Jun. 27, 2012.
U.S. Appl. No. 13/484,215, filed May 30, 2012.
Non-Final Office Action in U.S. Appl. No. 13/278,084 dated Dec. 6, 2012.

\* cited by examiner

HIGH ELECTRON MOBILITY TRANSISTOR STRUCTURE AND METHOD

CROSS REFERENCE TO RELATED APPLICATION

This application is a divisional of, and claims priority to, U.S. patent application Ser. No. 13/282,424 filed Oct. 26, 2011, titled "High Electron Mobility Transistor Structure and Method," the entire content and disclosure of which is incorporated by reference in its entirety.

FIELD

Embodiments of the present disclosure generally relate to the field of integrated circuits, and more particularly, to a high electron mobility transistor (HEMT) structure and method of fabrication.

BACKGROUND

A high electron mobility transistor (HEMT) is a type of field effect transistor (FET) in which a heterojunction is generally formed between two semiconductor materials having different bandgaps. In HEMTs, high mobility charge carriers are generally generated using, for example, a heterojunction of a highly-doped wide bandgap n-type donor-supply layer and a non-doped narrow bandgap channel layer. Current in a HEMT is generally confined to a very narrow channel at the junction, and flows between source and drain terminals, the current being controlled by a voltage applied to a gate terminal.

In general, a transistor may be classified as a depletion mode transistor or an enhancement mode transistor. In various applications, it may be desirable to have an enhancement mode switch device having a pinch-off voltage greater than 1 volt (V) and a relatively high maximum current density.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure provide structural configurations of an integrated circuit (IC) device such as, for example, a high electron mobility transistor (HEMT) switch device, and method of fabrication. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer," may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

Figure 1:
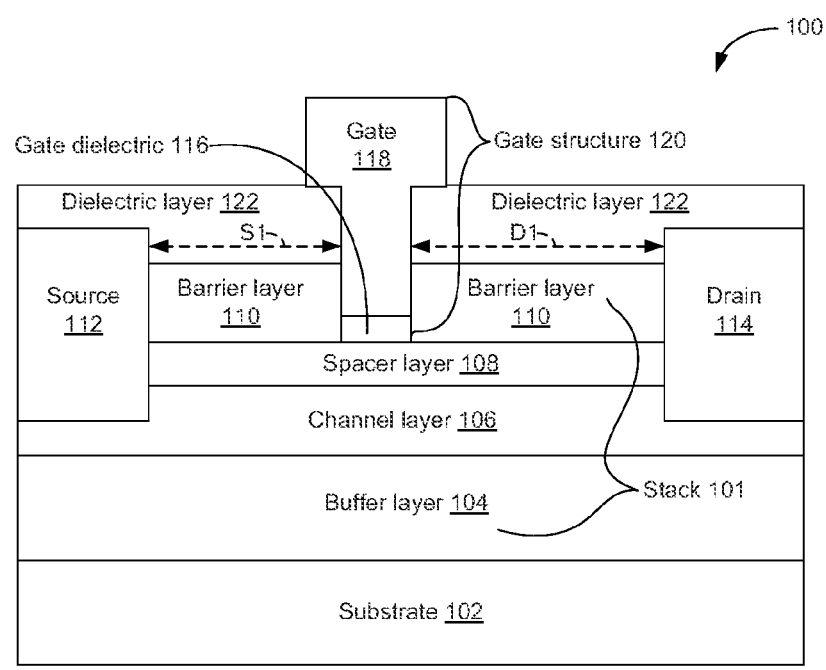
FIG. 1 schematically illustrates a cross-section view of an integrated circuit (IC) device, according to various embodiments.

FIG. 1 schematically illustrates a cross-section view of an integrated circuit (IC) device 100, according to various embodiments. The IC device 100 may be, for example, a HEMT device.

The IC device 100 may be fabricated on a substrate 102. The substrate 102 generally includes a support material upon which a stack 101 of layers is deposited. In an embodiment, the substrate 102 includes silicon (Si), silicon carbide (SiC), aluminum oxide ($Al_2O_3$) or "sapphire," gallium nitride (GaN), and/or aluminum nitride (AlN). Other materials including suitable group II-VI and group III-V semiconductor material systems can be used for the substrate 102 in other embodiments. In an embodiment, the substrate 102 includes any material upon which GaN can be epitaxially grown.

The stack of layers 101 (or simply "stack 101") formed on the substrate 102 may include epitaxially deposited layers of different material systems that form one or more heterojunctions/heterostructures. In one embodiment, the stack 101 of the IC device 100 includes a buffer layer 104 formed on the substrate 102. The buffer layer 104 may provide a crystal structure transition between the substrate 102 and other components (e.g., channel layer 106) of the IC device 100, thereby acting as a buffer or isolation layer between the substrate 102 and other components of the IC device 100. For example, the buffer layer 104 may provide stress relaxation between the substrate 102 and other lattice-mismatched materials (e.g., the channel layer 106). The buffer layer 104 may be epitaxially coupled with the substrate 102.

In some embodiments, the buffer layer 104 may include aluminum gallium nitride ($Al_xGa_{1-x}N$), where x is a value between 0 and 1 that represents relative quantities of aluminum and gallium. In some embodiments, x has a value between about 0.05 (e.g., 5% Al) and about 1 (e.g., 100% Al). A value for x may be selected based on a desired pinch-off voltage for the IC device 100. For example, increasing a percentage (%) of Al in the $Al_xGa_{1-x}N$ may correspond with decreasing a pinch-off voltage of the IC device 100. In some embodiments, a 5% change in the Al composition results in about a 1 volt (V) shift of the pinch-off voltage. The buffer layer 104 may have a thickness between about 0.1 microns and about 2 microns in a direction that is substantially perpendicular to a surface of the substrate 102 upon which the buffer layer 104 is formed. The buffer layer 104 may include other suitable materials such as AlInGaN and/or thicknesses in other embodiments.

The stack 101 may further include a channel layer 106 formed on the buffer layer 104. The channel layer 106 may provide a pathway for current flow of mobile charge carriers between a source terminal, hereinafter source 112, and a drain terminal, hereinafter drain 114, of the IC device 100. The difference in bandgap values for various layers of the IC device 100 creates a heterojunction that is generally at the interface of a wider bandgap donor-supply layer (e.g., spacer layer 108 and/or barrier layer 110), which may be doped, and a narrower bandgap layer (e.g., the channel layer 106), which may not be doped. While in operation, a two-dimensional electron gas (2DEG) may form at the heterojunction allowing, for example, electrons to flow in a substantially two-dimensional plane through the channel layer 106. The channel layer 106 may be epitaxially coupled with the buffer layer 104.

In some embodiments, the channel layer 106 may include gallium nitride (GaN). The channel layer 106 may have a thickness between about 50 angstroms and about 150 angstroms in a direction that is substantially perpendicular to a surface of the buffer layer 104 upon which the channel layer 106 is formed. A thickness of the channel layer 106 may be selected based on a desired pinch-off voltage for the IC device 100. For example, decreasing a thickness of the channel layer 106 may correspond with increasing a pinch-off voltage of the IC device 100. The channel layer 106 may include other suitable materials such as InGaN and/or thicknesses in other embodiments.

The stack 101 of layers may further include a spacer layer 108 formed on the channel layer 106. The spacer layer 108 may be epitaxially coupled with the channel layer 106.

In some embodiments, the spacer layer 108 may include aluminum nitride (AlN) and have a thickness between about 5 angstroms and 30 angstroms in a direction that is substantially perpendicular to a surface of the channel layer 106 upon which the spacer layer 108 is formed. The spacer layer 108 may include other suitable materials and/or thicknesses in other embodiments. In some embodiments, the spacer layer 108 is a growth layer or seed layer that facilitates crystalline formation of the barrier layer 110.

The stack 101 of layers may further include a barrier layer 110 formed on the spacer layer 108. The barrier layer 110 may be epitaxially coupled with the spacer layer 108.

In some embodiments, the barrier layer 110 may include aluminum (Al), nitrogen (N), and at least one of indium (In) and/or gallium (Ga). In an embodiment, the barrier layer 110 includes indium aluminum nitride ($In_yAl_{1-y}N$), where y is a value between 0 and 1 that represents relative quantities of indium and aluminum. The composition of the barrier layer 110 may complement the composition of the channel layer 106. For example, in some embodiments, the composition of indium in the barrier layer 110 may be reflected by y=0.18. This indium concentration provides the barrier layer 110 with a lattice structure that matches a lattice structure of the channel layer 106. Such matching may result in relatively low stress, which may provide the IC device 100 with increased reliability through operation. While variance from an 18% concentration of indium may increase lattice structure mismatch, such variance may also provide desirable operating characteristics for particular embodiments. For example, decreasing the concentration of indium to 13%, for example, may induce more charge (current) but may also increase the stress in the IC device 100. Conversely, increasing the concentration of indium to 21%, for example, may induce less charge but may also reduce the overall stress in the IC device 100. In some embodiments, y has a value between about 0.13 and about 0.21. Other values for y can be used in other embodiments.

In some embodiments, the barrier layer 110 may include indium gallium nitride ($In_yGa_{1-y}N$) where y is a value between 0 and 1 that represents a relative quantity of indium and gallium. In other embodiments, the barrier layer 110 may include indium gallium aluminum nitride ($In_yGa_zAl_{1-y-z}N$), where y and z are each a value between 0 and 1 that represents a relative quantity of indium and gallium, respectively. The relative quantity of aluminum can be calculated based on the relative quantities of indium and gallium.

The barrier layer 110 may have a thickness between about 50 angstroms and about 150 angstroms in a direction that is substantially perpendicular to a surface of the spacer layer 108 upon which the barrier layer 110 is formed. The barrier layer 110 may include other suitable materials and/or thicknesses in other embodiments.

The IC device 100 further includes a gate structure 120 having a gate terminal 118 and a gate dielectric 116. The gate terminal 118 serves as a connection terminal for the IC device 100 and the gate dielectric 116 reduces current flow in the IC device 100 to substantially zero when the IC device 100 is switched off.

The gate dielectric 116 may be formed on the spacer layer 108. For example, the barrier layer 110 can be selectively recessed to form an opening that allows deposition of an electrically insulative material to form the gate dielectric 116 on the spacer layer 108. In an embodiment, the gate dielectric is directly coupled with the spacer layer 108. In some embodiments, the gate dielectric 116 includes aluminum oxide ($Al_2O_3$), silicon nitride (SiN), hafnium oxide ($HfO_2$), silicon dioxide ($SiO_2$) or silicon oxy-nitride (SiON). In some embodiments, the gate dielectric 116 has a thickness between about 20 angstroms and 200 angstroms. Other materials and/or thicknesses can be used for the gate dielectric 116 in other embodiments including, for example, other stoichiometries or relative quantities of the elements for the example materials listed above.

The gate terminal 118 may be formed on the gate dielectric 116 and directly coupled with the gate dielectric 116. In some embodiments, a portion of the gate terminal 118 is formed in the opening of the barrier layer 110. The portion of the gate terminal 118 formed in the opening of the barrier layer 110 may be part of a trunk or bottom portion of the gate terminal 118, as can be seen. A top portion of the gate terminal 118 may extend away from the trunk portion of the gate terminal 118 in opposing directions that are substantially perpendicular to a lengthwise direction of the trunk portion of the gate terminal 118, as can be seen. Such configuration of the trunk portion and top portion of the gate terminal 118 may be referred to as a T-shaped gate. In some embodiments, the gate terminal 118 may include a field-plate gate, which may increase a breakdown voltage and/or reduce an electric field between the gate terminal 118 and the drain 114.

The gate terminal 118 generally includes an electrically conductive material such as a metal. In some embodiments, the gate terminal 118 includes nickel (Ni), platinum (Pt), iridium (Ir), molybdenum (Mo), gold (Au), and/or aluminum (Al). In an embodiment, the gate terminal 118 includes material deposited in the following order: Ni followed by Pt, which is followed by Ir, which is followed by Mo, which is followed by Au. In an embodiment, a material including Ni/Pt/Ir/Mo is disposed in the trunk portion of the gate terminal 118 to provide a gate contact with the gate dielectric 116 material and a material including Au is disposed in the top portion of the gate terminal 118 to ensure conductivity and low resistance of the gate terminal 118.

In some embodiments, the gate terminal 118, the gate dielectric 116, and the spacer layer 108 are respective components of a metal-insulator-semiconductor (MIS) structure. The gate terminal 118 may be capacitively coupled with the spacer layer 108 and/or channel layer 106 through the gate dielectric 116. The MIS structure that includes the gate dielectric 116 may provide an effective switch device for power-switch applications including power conditioning applications such as, for example, Alternating Current (AC)-Direct Current (DC) converters, DC-DC converters, DC-AC converters, and the like. A Schottky-type barrier between the gate terminal 118 and the spacer layer 108 or channel layer 106 may not be ideal or effective in such switch applications owing to more persistent current flow/leakage when an off-voltage is applied to the Schottky-type barrier.

In some embodiments, the IC device 100 may include an enhancement mode (e-mode) switch device, which uses a positive gate voltage of gate terminal 118 with respect to source voltage of source 112 in order for current to flow in the IC device 100. This is in contrast to a depletion mode (d-mode) device, which uses a negative gate voltage with respect to source voltage in order to pinch-off current flow in the IC device 100. The ability to operate the IC device 100 as an e-mode switch, as opposed to a d-mode switch, may be due in part to the material systems described and used for the stack 101 and/or the tuning of the pinch-off voltage by varying the thickness and/or materials (e.g., Al) of the buffer layer 104 and/or the channel layer 106 as described herein. Configurations described herein for the IC device 100 may provide an e-mode switch device having a pinch-off voltage greater than 1 volt (V) and a relatively high maximum current density of about 2.5 amperes (A)/millimeter (mm) of gate width.

The IC device 100 may include a source 112 and drain 114 formed on the barrier layer 110. Each of the source 112 and the drain 114 may extend through the barrier layer 110 and the spacer layer 108 into the channel layer 106, as can be seen. According to various embodiments, the source 112 and the drain 114 are ohmic contacts. The source 112 and the drain 114 may include re-grown contacts that may provide a relatively lower contact resistance than standard grown contacts. In embodiments, the contact resistance of the source 112 and the drain 114 is about 0.01 ohm·mm.

The source 112 and the drain 114 may each include an electrically conductive material such as metal. In an embodiment, each of the source 112 and the drain 114 include titanium (Ti), aluminum (Al), molybdenum (Mo), gold (Au), or silicon (Si), or combinations thereof. Other materials can be used in other embodiments.

In an embodiment, a distance D1 between the drain 114 and the gate 118 is greater than a distance S1 between the source 112 and the gate 118. The distance D1 may be a shortest distance between the drain 114 and the gate 118 and the distance S1 may be a shortest distance between the source 112 and the gate 118 in some embodiments. Providing a shorter distance S1 than distance D1 may increase a gate 118 to drain 114 breakdown voltage and/or reduce source 112 resistance.

A dielectric layer 122 may be formed on the barrier layer 110 in some embodiments. The dielectric layer 112 may include, for example, silicon nitride (SiN). Other materials can be used for the dielectric layer 122 in other embodiments.

Figure 2:
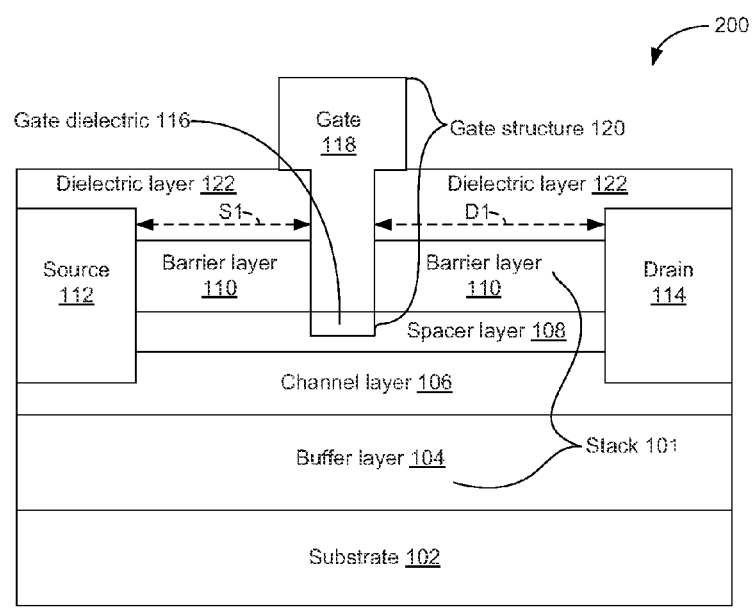
FIG. 2 schematically illustrates a cross-section view of another integrated circuit (IC) device, according to various embodiments.

FIG. 2 schematically illustrates a cross-section view of another integrated circuit (IC) device 200, according to various embodiments. The IC device 200 of FIG. 2 may comport with embodiments described in connection with the IC device 100 of FIG. 1 except that the gate structure 120 of the IC device 200 extends into the spacer layer 108. In some embodiments, the gate dielectric 116 may extend into the spacer layer 108. For example, the spacer layer 108 may be recessed, at least in part, using a process that is similar or the same as the process used to recess the barrier layer 110. The gate dielectric 116 may be formed in the recessed portion of the spacer layer 108 and the gate 118 may be formed on the gate dielectric 116.

Figure 3:
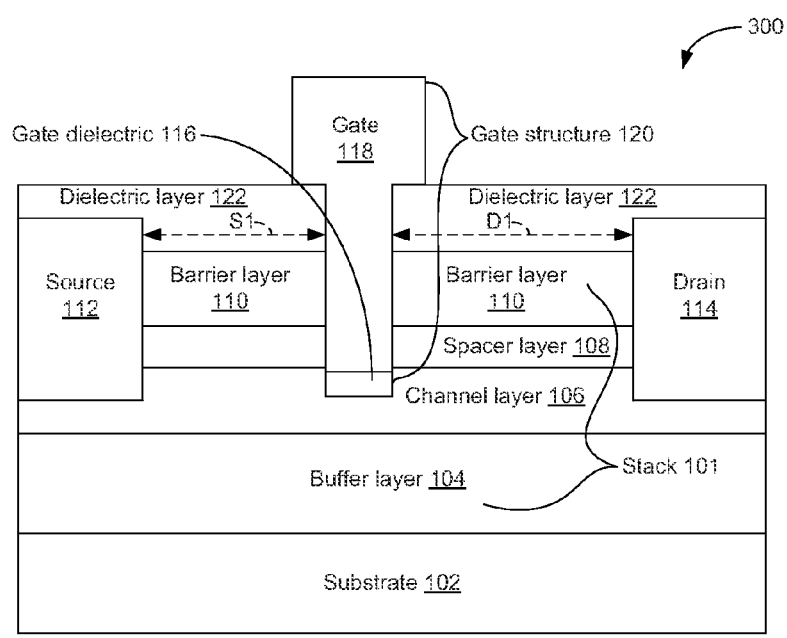
FIG. 3 schematically illustrates a cross-section view of yet another integrated circuit (IC) device, according to various embodiments.

FIG. 3 schematically illustrates a cross-section view of yet another integrated circuit (IC) device 300, according to various embodiments. The IC device 300 of FIG. 3 may comport with embodiments described in connection with the IC device 100 of FIG. 1 except that the gate structure 120 of the IC device 300 extends into the channel layer 106. In some embodiments, the gate dielectric 116 may extend into the channel layer 108. For example, the spacer layer 108 and the channel layer 106 may be recessed using a process that is similar or the same as the process used to recess the barrier layer 110. The gate dielectric 116 may be formed in the recessed portion of the channel layer 106 and the gate 118 may be formed on the gate dielectric 116. In other embodiments, the gate dielectric 116 may be formed on the buffer layer 104 by recessing through the channel layer 106 or may be formed to extend into the buffer layer 104 by recessing a portion of the buffer layer 104.

Figure 4:
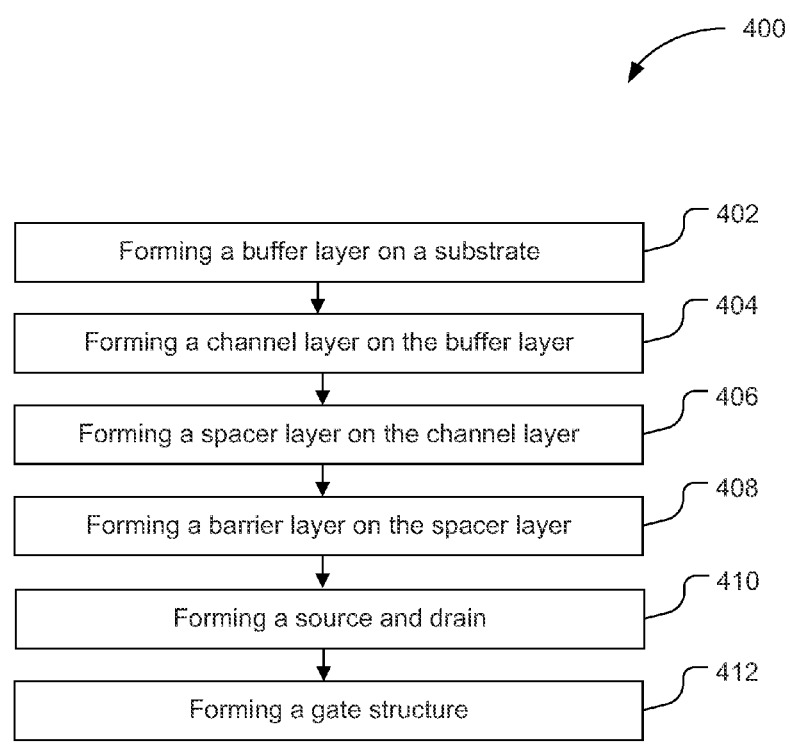
FIG. 4 is a flow diagram of a method for fabricating an integrated circuit device, according to various embodiments.

FIG. 4 is a flow diagram of a method 400 for fabricating an IC device (e.g., the IC device 100 of FIG. 1), according to various embodiments. The method 400 may include forming a buffer layer (e.g., buffer layer 104 of FIG. 1) on a substrate (e.g., substrate 102 of FIG. 1) at 402, forming a channel layer (e.g., channel layer 106 of FIG. 1) on the buffer layer at 404, forming a spacer layer (e.g., spacer layer 108 of FIG. 1) on the channel layer at 406, and forming a barrier layer (e.g., barrier layer 110 of FIG. 1) on the spacer layer at 408. According to various embodiments, each of the buffer layer, the channel layer, the spacer layer, and the barrier layer is epitaxially deposited by molecular beam epitaxy (MBE), atomic layer epitaxy (ALE), chemical beam epitaxy (CBE) and/or metal-organic chemical vapor deposition (MOCVD). Other suitable deposition techniques can be used in other embodiments. The forming of layers at 402, 404, 406, and 408 may provide a stack (e.g., stack 101 of FIG. 1) of epitaxially coupled layers. Materials and/or thicknesses for the layers of the stack may comport with embodiments already described in connection with the IC device 100 of FIG. 1.

At 410, the method 400 may further include forming a source (e.g., source 112 of FIG. 1) and drain (e.g., drain 114 of FIG. 1). The source and drain may be formed on the barrier layer. In an embodiment, materials such as one or more metals are deposited on the barrier layer in an area where the source and drain are to be formed using, e.g., an evaporation process. The materials used to form the source and the drain can include metals deposited in the following order: titanium (Ti) followed by aluminum (Al), which is followed by molybdenum (Mo), which is followed by titanium (Ti), which is followed by gold (Au). The deposited materials are heated (e.g., to about 850° C. for about 30 seconds using a rapid thermal anneal process) to cause the materials to penetrate and fuse with underlying material of the barrier layer, the spacer layer, and/or the channel layer. In embodiments, each of the source and the drain extends through the barrier layer and the spacer layer into the channel layer. A thickness of the source and the drain can be between about 1000 angstroms and 2000 angstroms. Other thicknesses for the source and the drain can be used in other embodiments.

The source and the drain may be formed by a re-growth process to provide ohmic contacts having a reduced contact resistance or reduced on resistance. In the re-growth process, material of the barrier layer, the spacer layer, and the channel layer is selectively removed (e.g., etched) in areas where the source and the drain are to be formed. A highly doped material (e.g., n++ material) is deposited in the areas where the barrier layer, the spacer layer, and the channel layer have been selectively removed. The highly doped material of the source and drain may be a similar material as the material used for the channel layer. For example, in a system where the channel layer includes GaN, a GaN-based material that is highly doped with silicon (Si) may be epitaxially deposited in the selectively removed areas to a thickness between about 400 angstroms and 700 angstroms. The highly doped material can be epitaxially deposited by molecular beam epitaxy (MBE), atomic layer epitaxy (ALE), chemical beam epitaxy (CBE), or metal-organic chemical vapor deposition (MOCVD), or suitable combinations thereof. Other materials, thicknesses, or deposition techniques for the highly doped material can be used in other embodiments. One or more metals including, e.g., titanium (Ti) and/or gold (Au) can be formed/deposited on the highly doped material at a thickness between about 1000 angstroms and 1500 angstroms using, e.g., a lift-off process. Other materials, thicknesses, and/or techniques for the one or more metals can be used in other embodiments.

In some embodiments, the source and the drain may be formed by an implantation process that uses implantation techniques to introduce an impurity (e.g., silicon) to provide a highly doped material in the source and the drain. After implantation, the source and the drain are annealed at a high temperature (e.g., 1100-1200° C.). The re-growth process may preferably avoid the high temperature associated with the post-implantation anneal.

At 412, the method 400 may further include forming a gate structure (e.g., the gate structure 120 of FIG. 1). The gate structure may include an electrically conductive portion or gate (e.g., gate 118 of FIG. 1) and an electrically insulative portion or gate dielectric (e.g., gate dielectric 116 of FIG. 1).

The gate dielectric may be formed on the spacer layer. A portion of the barrier layer may be selectively recessed to provide an opening through the barrier layer. In an embodiment, an etch process selectively removes material of the barrier layer to expose the spacer layer.

In some embodiments, a dielectric layer (e.g., dielectric layer 122 of FIG. 1) is formed on the barrier layer and photoresist is deposited on the dielectric layer and patterned to provide an opening that corresponds with the opening to be formed in the barrier layer. In an embodiment, an anisotropic etch process may selectively remove material from the dielectric layer and underlying barrier layer to expose the spacer layer for deposition of the gate dielectric material. The spacer layer may be treated and/or cleaned to minimize trap density between the gate dielectric and the spacer layer.

In other embodiments, an anisotropic etch process may remove material from the dielectric layer, the barrier layer, the spacer layer (e.g., the spacer layer 108 of FIG. 2), the channel layer (e.g., the channel layer 106 of FIG. 3), and/or the buffer layer to allow the formation of the gate dielectric such that the gate dielectric extends into the spacer layer, the channel layer, and/or the buffer layer as described in connection with FIGS. 2 and 3. Similar treatment and/or cleaning may be used to minimize trap density between the gate dielectric and the channel layer or between the gate dielectric and the buffer layer in some embodiments.

The gate dielectric material may be deposited on the spacer layer by any suitable deposition technique including, for example, atomic layer deposition (ALD) or chemical vapor deposition (CVD). Other deposition techniques can be used in other embodiments. Thicknesses and/or materials for the gate dielectric may comport with embodiments already described in connection with FIG. 1.

The gate may be formed on the gate dielectric by depositing a gate material on the gate dielectric in the opening of the barrier layer. The gate material can be deposited by any suitable deposition process including, for example, evaporation, ALD and/or CVD. In an embodiment, Nickel (Ni) is deposited first on the gate dielectric followed by sequential deposition of platinum (Pt), iridium (Ir), and molybdenum (Mo). Gold (Au) may be sequentially deposited on the molybdenum. In an embodiment where the gate is a T-shaped gate, a trunk portion of the T-gate may be formed by depositing one or more metals to fill the opening formed in the barrier layer and in the dielectric layer to facilitate formation of the gate dielectric. A top portion of the T-gate may be formed by metal deposition/etch processes or a lift-off process.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

Figure 5:
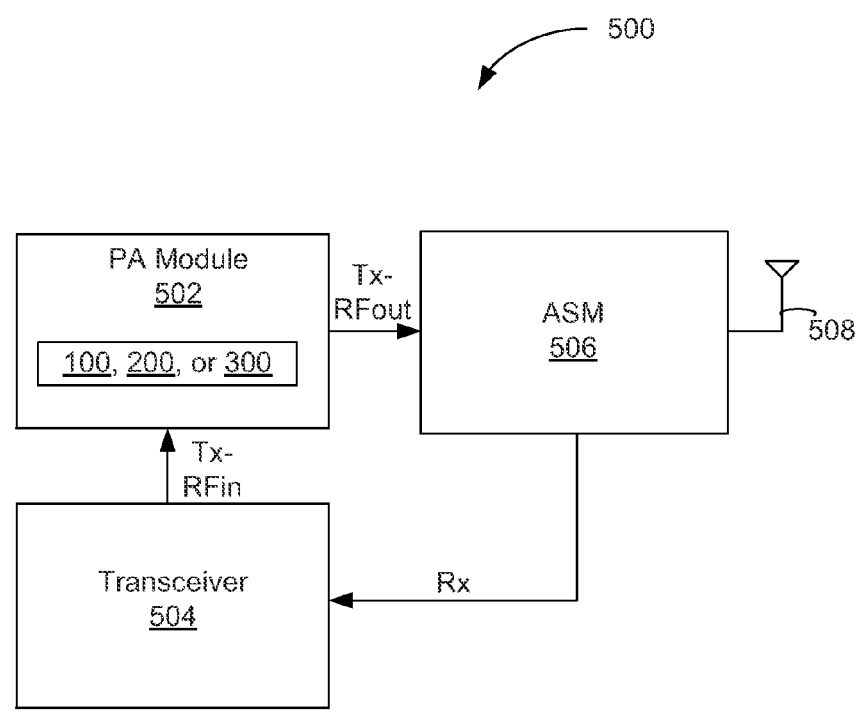
FIG. 5 schematically illustrates an example system including an IC device, according to various embodiments.

Embodiments of an IC device 100 described herein, and apparatuses including such IC device 100, may be incorporated into various other apparatuses and systems. A block diagram of an example system 500 is illustrated in FIG. 5. As illustrated, the system 500 includes a power amplifier (PA) module 502, which may be a Radio Frequency (RF) PA module in some embodiments. The system 500 may include a transceiver 504 coupled with the power amplifier module 502 as illustrated. The power amplifier module 502 may include an IC device (e.g., the IC device 100, 200, or 300 of FIGS. 1-3) described herein.

The power amplifier module 502 may receive an RF input signal, RFin, from the transceiver 504. The power amplifier module 502 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 5.

The amplified RF output signal, RFout, may be provided to an antenna switch module (ASM) 506, which effectuates an over-the-air (OTA) transmission of the RF output signal, RFout, via an antenna structure 508. The ASM 506 may also receive RF signals via the antenna structure 508 and couple the received RF signals, Rx, to the transceiver 504 along a receive chain.

In various embodiments, the antenna structure 508 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

The system 500 may be any system including power amplification. The IC device 100, 200, or 300 may provide an effective switch device for power-switch applications including power conditioning applications such as, for example, Alternating Current (AC)-Direct Current (DC) converters, DC-DC converters, DC-AC converters, and the like. In various embodiments, the system 500 may be particularly useful for power amplification at high radio frequency power and frequency. For example, the system 500 may be suitable for any one or more of terrestrial and satellite communications, radar systems, and possibly in various industrial and medical applications. More specifically, in various embodiments, the system 500 may be a selected one of a radar device, a satellite communication device, a mobile handset, a cellular telephone base station, a broadcast radio, or a television amplifier system.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

The invention claimed is:

1. An apparatus comprising:
a buffer layer formed on a substrate, the buffer layer being epitaxially coupled with the substrate;
a channel layer formed on the buffer layer to provide a pathway for current flow in a transistor device, the channel layer being epitaxially coupled with the buffer layer, wherein at least a portion of the channel layer is recessed;
a spacer layer formed on the channel layer, the spacer layer being epitaxially coupled with the channel layer;
a barrier layer formed on the spacer layer, the barrier layer being epitaxially coupled with the spacer layer, the barrier layer including aluminum (Al), nitrogen (N), and at least one of indium (In) or gallium (Ga);
a gate dielectric directly coupled with the channel layer and formed within the recessed portion of the channel layer, wherein the gate dielectric includes a gate dielectric to surface and the channel layer includes a channel layer to surface, and wherein the channel layer to surface is lower than the gate dielectric to surface; and
a gate electrode formed on the gate dielectric, the gate electrode being directly coupled with the gate dielectric, wherein each of the barrier layer, the spacer layer and the channel layer include first and second vertical sidewall surfaces, and wherein the gate electrode is in contact with the first and second vertical sidewall surfaces of the barrier layer, the spacer layer and the channel layer.

2. The apparatus of claim 1, wherein:
the buffer layer includes aluminum gallium nitride ($Al_xGa_{1-x}N$), where x is a value between 0 and 1 that represents relative quantities of aluminum and gallium;
the channel layer includes gallium nitride (GaN);
the spacer layer includes aluminum nitride (AlN); and
the barrier layer includes indium aluminum nitride ($In_yAl_{1-y}N$), where y is a value between 0 and 1 that represents relative quantities of indium and aluminum.

3. The apparatus of claim 2, wherein:
the buffer layer has a thickness between 0.1 microns and 2 microns and x has a value between 0.05 and 1;
the channel layer has a thickness between 50 angstroms and 150 angstroms;
the spacer layer has a thickness between 5 angstroms and about 30 angstroms; and
the barrier layer has a thickness between 50 angstroms and 150 angstroms and y has a value between 0.13 and 0.21.

4. The apparatus of claim 1, wherein:
the gate dielectric includes aluminum oxide ($Al_2O_3$), silicon nitride (SiN), hafnium oxide ($HfO_2$), silicon dioxide ($SiO_2$) or silicon oxy-nitride (SiON); and
the gate dielectric has a thickness between 20 angstroms and 200 angstroms.

5. The apparatus of claim 4, wherein:
the gate electrode is a T-shaped field plate gate; and
the gate electrode includes nickel (Ni), platinum (Pt), iridium (Ir), molybdenum (Mo), or gold (Au).

6. The apparatus of claim 1, further comprising:
a source formed on the barrier layer; and
a drain formed on the barrier layer, wherein each of the source and the drain extend through the barrier layer and the spacer layer into the channel layer.

7. The apparatus of claim 6, wherein:
the source is an ohmic contact;
the drain is an ohmic contact; and
a shortest distance between the drain and the gate electrode is greater than a shortest distance between the source and the gate electrode.

8. The apparatus of claim 1, further comprising:
the substrate, wherein the substrate includes silicon (Si), silicon carbide (SiC), sapphire ($Al_2O_3$), gallium nitride (GaN), or aluminum nitride (AlN).

9. The apparatus of claim 1, further comprising:
a dielectric layer formed on the barrier layer.

10. The apparatus of claim 1, wherein the gate electrode is part of an enhancement mode (e-mode) high electron mobility transistor (HEMT) switch device.

* * * * *

UNITED STATES PATENT AND TRADEMARK OFFICE
CERTIFICATE OF CORRECTION

| | | |
|---|---|---|
| PATENT NO. | : 9,054,167 B2 | Page 1 of 1 |
| APPLICATION NO. | : 13/941413 | |
| DATED | : June 9, 2015 | |
| INVENTOR(S) | : Paul Saunier | |

It is certified that error appears in the above-identified patent and that said Letters Patent is hereby corrected as shown below:

In the claims

Column 9, in claim 1, lines 17, 18, 19, 20 replace "to" with --top--

Signed and Sealed this
Fifteenth Day of December, 2015

Michelle K. Lee
*Director of the United States Patent and Trademark Office*